United States Patent
Lee et al.

(10) Patent No.: US 8,325,073 B2
(45) Date of Patent: Dec. 4, 2012

(54) PERFORMING ENHANCED SIGMA-DELTA MODULATION

(75) Inventors: Chong U. Lee, San Diego, CA (US); Yuriy Reznik, Seattle, WA (US); John H. Hong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 183 days.

(21) Appl. No.: 12/957,149

(22) Filed: Nov. 30, 2010

(65) Prior Publication Data
US 2012/0133537 A1   May 31, 2012

(51) Int. Cl.
*H03M 3/00* (2006.01)
(52) U.S. Cl. .......... 341/143; 341/155; 341/159
(58) Field of Classification Search .......... 341/143, 341/155, 156, 159
See application file for complete search history.

(56) References Cited

U.S. PATENT DOCUMENTS

| | | | |
|---|---|---|---|
| 5,148,486 A | | 9/1992 | Kudoh |
| 5,162,799 A | * | 11/1992 | Tanimoto ............... 341/143 |
| 5,838,272 A | * | 11/1998 | Steiner et al. ........... 341/143 |
| 6,081,219 A | * | 6/2000 | Prasanna ............... 341/159 |
| 6,097,251 A | * | 8/2000 | Khullar et al. ........... 330/129 |
| 6,101,224 A | * | 8/2000 | Lindoff et al. ........... 375/300 |
| 6,590,513 B2 | | 7/2003 | Stetson et al. |
| 6,876,698 B1 | | 4/2005 | Dick et al. |
| 7,079,068 B2 | | 7/2006 | Clement et al. |
| 7,289,050 B1 | * | 10/2007 | Laroia et al. ........... 341/143 |
| 7,405,686 B2 | * | 7/2008 | Laroia et al. ........... 341/143 |
| 8,009,072 B2 | * | 8/2011 | Rigby et al. ........... 341/143 |
| 2007/0290906 A1 | | 12/2007 | Reefman et al. |
| 2010/0057472 A1 | | 3/2010 | Zeng et al. |

FOREIGN PATENT DOCUMENTS
JP   2008278032 A   11/2008

OTHER PUBLICATIONS

D. Reefman, J. Reiss, E. Janssen, and M. Sandler, "Description of Limit Cycles in Sigma-Delta Modulators," IEEE Transactions on Circuits and Systems—I: Regular Papers, vol. 52, No. 6, pp. 1211-1223, Jun. 2005.
E. N. Gilbert, "Capacity of burst noise channels," Bell Syst. Tech. J., vol. 39, pp. 1253-1256, 1960.
J. H. Chen, "High-quality 16 kb/s speech coding with a one-way delay less than 2 ms," in Proc. ICASSP-91, pp. 453-456 (Apr. 1990).

(Continued)

*Primary Examiner* — Jean B Jeanglaude
(74) *Attorney, Agent, or Firm* — John Rickenbrode

(57) ABSTRACT

In general, techniques are described for performing enhanced sigma-delta modulation. For example, an apparatus comprising a predictive filter unit, an amplifier, an oversampling unit and a sigma-delta modulation unit may implement the techniques. The predictive filter unit performs predictive filtering on an input signal to generate a filtered signal and computes an estimate of a predictive gain as a function of an energy of the input signal and an energy of the filtered signal. The amplifier receives the filtered signal and amplifies the filtered signal based on the predictive gain to generate an amplified signal. The oversampling unit receives the amplifies signal and performs oversampling in accordance with an oversampling rate to generate an oversampled signal. The sigma-delta modulation unit receives the oversampled signal and performs sigma-delta modulation to generate a modulated signal.

67 Claims, 8 Drawing Sheets

OTHER PUBLICATIONS

J. H. Chen, Y. Lin, and R. V. Cox, "A fixed-point 16 kb/s LD-CELP algorithm," In Proceedings of the Acoustics, Speech, and Signal Processing (ICASSP-91) (Apr. 14-17, 1991).

J. R. Zeidler, "Performance Analysis of LMS Adaptive Prediction Filters," Proceedings of the IEEE, vol. 78, No. 12, pp. 1781-1806, Dec. 1990.

J. Rissanen, "Universal coding, information, prediction, and estimation," Information Theory, IEEE Transactions, vol. 30, No. 4, pp. 629-636, Jul. 1984 URL: http://ieeexplore.ieee.org/stamp/stamp.jsp?arnumber=1056936&isnumber=22743.

Kuniharu Uchimura, Toshio Hayashi, Tadakatsu Kimura and Atsushi Iwata, "Oversampling A-to-D and D-to-A Converters with Multistage Noise Shaping Modulators," IEEE Trans. Acoustics, Speech and Signal Processing, vol. 36, No. 12, pp. 1899-1905.

L. Davisson, "The prediction error of stationary Gaussian time series of unknown covariance," Information Theory, IEEE Transactions, vol. 11, No. 4, pp. 527-532, Oct. 1965 URL: http://ieeexplore.ieee.org/stamp/stamp.jsp?arnumber=1053829&isnumber=22628.

R. Kok and D. M. Weber, "On designing sigma-delta converter systems for class-D power amplifiers," in AFRICON, 1999 IEEE, 1999, pp. 715-718, vol. 2.

T. Drumright, "Adaptive Filtering," pp. 1-35, Spring 1998.

T. Moriya, "Medium-delay 8 kbit/s speech coder based on conditional pitch prediction," in Proc. of Int. Conf. Spoken Language Processing (Nov. 1990).

T. P. Barnwell, III, "Recursive windowing for generating autocorrelation coefficients for LFC analysis," Trans. ASSP, vol. ASSP-29, No. 5, pp. 1062-1066 (Oct. 1981).

* cited by examiner

PERFORMING ENHANCED SIGMA-DELTA MODULATION

TECHNICAL FIELD

This disclosure relates to encoding of signals and, more particularly, the encoding of signals using sigma-delta modulation.

BACKGROUND

Generally, sigma-delta modulation (SDM) refers to a process of encoding high resolution signals, such as analog signals, into lower resolution signals, such as digital signals, using pulse-density modulation (PDM). PDM refers to a form of modulation where analog signals are represented with digital data such that the signal resulting from pulse-density modulation expresses the analog signal's amplitude through its relative bit density. Sigma-delta demodulation refers to the inverse process of reconstructing the analog signal from the lower resolution digital signal. Commonly, sigma-delta modulation and demodulation is employed by analog-to-digital converters (ADC's), digital-to-analog converters (DAC's), frequency synthesizers, switched-mode power supplies, control circuits for class-D amplifiers and motor controls to name a few examples.

A sigma-delta modulator is constructed as a linear combination of an integrator unit and a quantizer unit where the output of the integrator unit feeds into the input of the quantizer unit. The output of the quantizer unit is the output signal of the sigma-delta modulator. This output also is part of a feedback loop that feeds the output signal back to a summation unit whose output is fed to the input of the integrator unit. This summation unit, integrator unit and quantizer unit forms what is commonly referred to as a first order sigma-delta modulator. Adding additional integrator units in-line before the summation unit increases the order by one for each additional integrator added in-line before the summation unit.

To achieve a desired signal-to-noise ratio (SNR), such as a 90 to 100 dB SNR, for the output signal of a sigma delta modulator, the sigma-delta modulator may be modified in two ways. In a first way, the order of the sigma-delta modulator may be increased, although increasing the order above a fourth or fifth order generally results in an unstable sigma-delta modulator. In the second way, the oversampling rate (OSR) of the sigma-delta modulator may be increased. However, increasing the OSR of the sigma-delta modulator increases the number of bits required to accurately represent the input signal. Increasing the number of bits may be a significant consideration in sigma-delta modulator applications that communicate the output signal over a limited bandwidth channel, such as a wireless channel in which sigma-delta modulators may be employed in analog-to-digital (A/D) converters or digital-to-analog (D/A) converters in mobile phones. The increase of bits may consume more wireless channel bandwidth.

SUMMARY

In general, this disclosure describes techniques for performing enhanced sigma-delta modulation. The sigma-delta modulation described in this disclosure may be considered enhanced, in some examples, in that it may provide a signal that has a better signal-to-noise ratio (SNR) than that produced by conventional sigma-delta modulation. In some examples, the sigma-delta modulation described in this disclosure may increase SNR without a substantial increase in the complexity of the enhanced sigma delta modulator in comparison to some conventional sigma delta modulators. A sigma delta modulator as described in this disclosure, when configured with a given order, may improve the SNR of the resulting signal in comparison to conventional sigma delta modulators of the same order when both the enhanced and conventional sigma-delta modulators employ the same OSR. In this respect, a sigma-delta modulator configured as described in this disclosure may be considered enhanced in comparison to similar conventional sigma-delta modulators.

In one example, a method of performing enhanced sigma delta modulation, the method comprises applying, with an apparatus, a predictive filter to an input signal so as to generate a filtered signal from the input signal and computing an estimate of a predictive gain as a function of an energy of the input signal and an energy of the filtered signal. The method also comprises amplifying, with the apparatus, the filtered signal based on the estimate of the predictive gain to generate an amplified signal, oversampling, with the apparatus, the amplified signal in accordance with an oversampling rate to generate an oversampled signal and performing sigma-delta modulation on the oversampled signal to generate a modulated signal.

In another example, an apparatus comprises a predictive filter unit that performs predictive filtering on an input signal to generate a filtered signal and computes an estimate of a predictive gain as a function of an energy of the input signal and an energy of the filtered signal and an amplifier that receives the filtered signal and amplifies the filtered signal based on the predictive gain to generate an amplified signal. The apparatus also includes an oversampling unit that receives the amplifies signal and performs oversampling in accordance with an oversampling rate to generate an oversampled signal and a sigma-delta modulation unit that receives the oversampled signal and performs sigma-delta modulation to generate a modulated signal.

In another example, an apparatus comprises means for performing predictive filtering on an input signal to generate a filtered signal and computes an estimate of a predictive gain as a function of an energy of the input signal and an energy of the filtered signal and means for amplifying the filtered signal based on the predictive gain to generate an amplified signal. The apparatus also comprises means for performing oversampling the amplified signal in accordance with an oversampling rate to generate an oversampled signal and means for performing sigma-delta modulation on the oversampled signal to generate a modulated signal.

In another example, a computer-readable storage medium is encoded with instructions that cause a programmable processor to apply a predictive filter to an input signal so as to generate a filtered signal from the input signal, compute an estimate of a predictive gain as a function of an energy of the input signal and an energy of the filtered signal, amplify the filtered signal based on the estimate of the predictive gain to generate an amplified signal, oversample the amplified signal in accordance with an oversampling rate to generate an oversampled signal and perform sigma-delta modulation on the oversampled signal to generate a modulated signal.

In another example, a method comprises receiving, with an apparatus, a modulated signal that was modulated using enhanced sigma-delta modulation and performing, with the apparatus, sigma-delta demodulation on the modulated signal to generate a demodulated signal. The method also comprises down-sampling, with the apparatus, the demodulated signal in accordance with a down-sampling rate to generate a down-sampled signal, performing, with the apparatus, inverse amplification on the down-sampled signal based on a determined predictive gain to generate an unamplified signal and performing, with the apparatus, inverse predictive filtering on the unamplified signal to generate a reconstructed signal.

In another example, an apparatus comprises a sigma-delta demodulation unit that receives a modulated signal and performs sigma-delta demodulation to generate a demodulated signal and a down-sampling unit that receives the demodulated signal and performs down-sampling in accordance with an down-sampling rate to generate an down-sampled signal. The apparatus also comprises an inverse amplification unit that receives the down-sampled signal and performs inverse amplification on the down-sampled signal based on a determined predictive gain to generate an unamplified signal and an inverse predictive filter unit that performs inverse predictive filtering on the unamplified signal to generate a reconstructed signal.

In another example, an apparatus comprises means for receiving a modulated signal that was modulated using enhanced sigma-delta modulation and means for performing sigma-delta demodulation on the modulated signal to generate a demodulated signal. The apparatus also comprises means for down-sampling the demodulated signal in accordance with a down-sampling rate to generate a down-sampled signal, means for performing inverse amplification on the down-sampled signal based on a determined predictive gain to generate an unamplified signal and means for performing inverse predictive filtering on the unamplified signal to generate a reconstructed signal.

In another example, a computer-readable storage medium is encoded with instructions that cause a programmable processor to receive a modulated signal that was modulated using enhanced sigma-delta modulation, perform sigma-delta demodulation on the modulated signal to generate a demodulated signal, down-sample the demodulated signal in accordance with a down-sampling rate to generate a down-sampled signal, perform inverse amplification on the down-sampled signal based on a determined predictive gain to generate an unamplified signal, and perform inverse predictive filtering on the unamplified signal to generate a reconstructed signal.

The details of one or more examples are set forth in the accompanying drawings and the description below. Other features, objects, and advantages will be apparent from the description and drawings, and from the claims.

DETAILED DESCRIPTION

Figure 1:
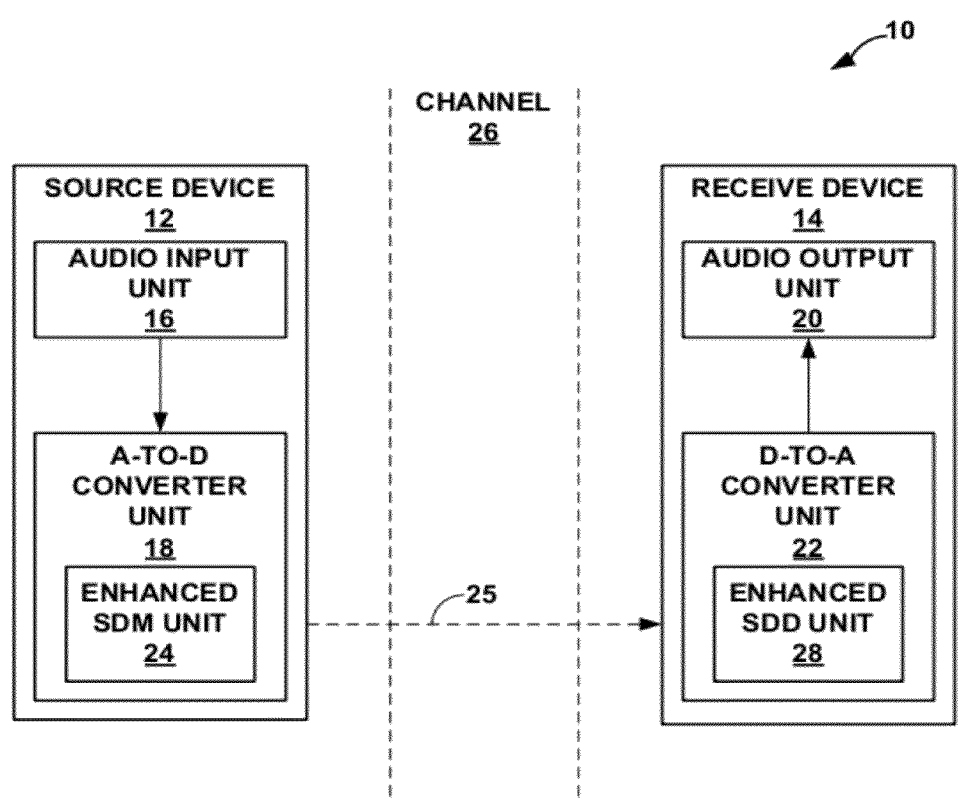
FIG. 1 is a block diagram illustrating an example system that implements enhanced sigma-delta modulation and demodulation techniques described in this disclosure.

FIG. 1 is a block diagram illustrating an example system 10 that implements enhanced sigma-delta modulation and demodulation techniques as described in this disclosure. In the example of FIG. 1, system 10 includes a source device 12 and a receive device 14. While described with respect to source device 12 and receive device 14, the techniques may be implemented by any device capable of performing sigma-delta modulation and/or sigma-delta demodulation. For this reason, the techniques should not be limited to the examples set forth in this disclosure.

As noted above, source device 12 may represent any device capable of performing sigma-delta modulation or both sigma-delta modulation and sigma-delta demodulation, although for purposes of illustration source device 12 represents a portable handset device, such as a mobile telephone, which may be configured as a so-called "smart phones." Source device 12 is referred to as a source device because it sources or otherwise generates or provides content or signals that are sent to receive device 14.

Receive device 14 may similarly represent any device capable of performing sigma-delta demodulation or both sigma-delta demodulation and sigma-delta modulation, although again for purposes of illustration receive device 14 in FIG. 1 represents a portable handset device, such as a mobile telephone configured as a so-called "smart phone." Receive device 14 may alternatively represent a portable media player, personal video recorder device, an audio playback device, or any other device capable of receiving signal 25 and reconstructing signal 25 in a manner consistent with the techniques set forth in this disclosure. Receive device 14 is referred to as a receive device because it receives the signals sourced by source device 12 and/or other source devices. While referred to as source device 12 and receive device 14, these devices may generally perform the same functions, meaning that receive device 14 may, in a different context, source signals in the same way that source device 12 sources signals in the example of FIG. 1. Likewise, source device 12 may, in this different context, receive signals in the same way that receive device 14 receives signals in the example of FIG. 1.

In the example of FIG. 1, source device 12 includes an audio input unit 16 and an analog-to-digital converter unit 18 ("A-to-D converter unit 18"). Audio input unit 16 may represent any type of unit or device for receiving analog audio signals, such as a microphone or other audio sensing hardware unit. Analog-to-digital converter unit 18 represents a unit, such as a electronic hardware unit, configured to convert analog signals, such as those received via audio input unit 16, to corresponding digital signals. Source device 12 may include a number of other units, modules or components in addition to those shown explicitly in the example of FIG. 1. For example, although not shown in the example of FIG. 1 for ease of illustration purposes, source device 12 may include one or more radio frequency (RF) antennas, one or more transmitter units, one or more receive units, one or more digital signal processing (DSP) units, one or more processors, one or more graphic processor units, one or more cameras or other image or video capture devices, one or more inputs for receiving headsets, headphones or any other form of connection for coupling audio and/or visual equipment to source device 12, one or more memories, and one or more storage devices.

While described with respect to audio in the example of FIG. 1, the enhanced sigma-delta modulation and demodulation techniques may be implemented with respect to other types of media, including video, image and speech media. Generally, the sigma-delta modulation and demodulation techniques of this disclosure may be adapted and applied to any conventional use of sigma-delta modulation or demodulation.

Receive device 14 includes an audio output unit 20 and a digital-to-analog converter unit 22 ("D-to-A converter unit 22"), which may be formed by an electronic hardware unit. Audio output unit 20 may represent any type of unit or device for outputting analog audio signals, such as a speaker, headset, headphones or any other type of audio output device or unit. Digital-to-analog converter unit 22 represents a unit to convert digital signals, such as those received from source device 12, to corresponding analog signals, which audio output unit 20 may output for consumption by a user of receive device 14. Receive device 14 may include a number of other units, modules or components in addition to those shown explicitly in the example of FIG. 1. For example, although not shown in the example of FIG. 1 for ease of illustration purposes, receive device 14 may include a one or more RF antennas, one or more transmitter units, one or more receive units, one or more digital signal processing (DSP) units, one or more processors, one or more graphic processor units, one or more cameras or other image or video capture devices, one or more inputs for receiving headsets, headphones or any other form of connection for coupling audio and/or visual equipment to receive device 14, one or more memories, and one or more storage devices.

Generally, analog-to-digital converter 18 converts analog signals to digital signals using a process referred to as sigma-delta modulation (SDM). Sigma-delta modulation involves encoding high resolution signals, such as analog signals, into lower resolution signals, such as digital signals, using pulse-density modulation (PDM). PDM refers to a form of modulation where analog signals are represented with digital data such that the signal resulting from pulse-density modulation expresses the analog signal's amplitude through its relative bit density. While described throughout this disclosure in reference to A-to-D converters, sigma-delta modulation may be employed in a number of other instances including instances of frequency synthesis, switched-mode power supplies, control circuits for class-D amplifiers and motor controls to name a few examples.

A sigma-delta modulator that implements sigma-delta modulation is typically constructed as a linear combination of an integrator unit and a quantizer unit where the output of the integrator unit feeds into the input of the quantizer unit. The output of the quantizer unit is the output signal of the sigma-delta modulator. This output also is part of a feedback loop that feeds the output signal back to a summation unit whose output is fed to the input of the integrator unit. This summation unit, integrator unit and quantizer unit forms what is commonly referred to as a first order sigma-delta modulator. Adding additional integrator units in-line before the summation unit increases the order by one for each additional integrator added in-line before the summation unit.

One way to measure the quality or accuracy of a given digital signal output by a sigma-delta modulation is to monitor a signal-to-noise ratio (SNR) of this output signal. Usually, an SNR of 90 to 100 decibels (dBs) for a signal output by a sigma-delta modulation unit is considered acceptable for most applications, i.e., analog-to-digital conversion in this example. To achieve this SNR for the output signal of a sigma delta modulator, the sigma-delta modulator may be modified in two ways. In a first way, the order of the sigma-delta modulator may be increased, although increasing the order above a fourth or fifth order generally results in an unstable sigma-delta modulator that is incapable of accurately reducing the analog or other high resolution signal to a lower-resolution digital signal. Order in this context refers to the number of integration units preceding and feedback loop that includes an integration unit and a quantization unit, where the feedback loop with the single integration unit is referred to as an order of one and each additional integration unit placed before the feedback loop increases the order by one.

In the second way, the oversampling rate (OSR) of the sigma-delta modulator may be increased. However, increasing the OSR of the sigma-delta modulator increases the number of bits required to accurately represent the input signal. Increasing the number of bits may be a significant consideration in sigma-delta modulator applications that communicate the output signal over a wireless channel, such as when sigma-delta modulators are employed in analog-to-digital (A/D) converters or digital-to-analog (D/A) converters in mobile phones or other mobile computing devices, as is the case in the present example of FIG. 1. The increase of bits may consume more channel bandwidth, e.g., wireless channel bandwidth in the case of a mobile device. Usually, this second way is chosen by systems engineers or other system designers due to the fourth or fifth order design limit on sigma-delta modulators.

In accordance with the techniques described in this disclosure, analog-to-digital converter 18 performs a form of enhanced sigma-delta modulation. Analog-to-digital converter 18 includes an enhanced sigma-delta modulation unit 24 ("enhanced SDM unit 24") that implements various aspects of this enhanced SDM techniques. The sigma-delta modulation may be considered enhanced in that it provides a signal that typically has a better signal-to-noise ratio (SNR) than that produced through conventional sigma-delta modulation without overly increasing the complexity of the enhanced sigma delta modulator in comparison to conventional sigma delta modulators. Enhanced sigma-delta modulation of a given order may improve the SNR of the resulting signal in comparison to conventional sigma-delta modulation of the same order when both the enhanced and conventional sigma-delta modulation is at the same OSR. In this respect, in some examples, the sigma-delta modulation techniques described in this disclosure may be considered enhanced in comparison to similar conventional sigma-delta modulation.

To perform these enhanced sigma-delta modulation techniques, enhanced SDM unit 24 first applies a predictive filter to the input signal so as to generate a filtered or residual signal from the input signal. Predictive filtering may involve, as one example, filtering in accordance with a least-mean-square (LMS) algorithm. Filtering using the LMS algorithm may be characterized as a form of adaptive filtering used to mimic a desired filter by finding the filter coefficients that relate to producing the least-mean-square of the error signal, which is the difference between the desired signal and the actual signal. Generally, this LMS predictive filter lowers the energy of the residual signal output from the predictive filter in comparison to the energy of the input signal.

After generating the residual signal, enhanced SDM unit 24 applies a factor, which is referred to as a predictive gain, to upscale the residual signal, generating an amplified signal. In other words, enhanced SDM unit 24 amplifies the filtered or residual signal based on the predictive gain to generate an amplified signal. Enhanced SDM unit 24 may compute this predictive gain factor as a function of the energy of the input signal divided by the energy of the residual signal. This amplified signal is then passed to what may be considered a conventional sigma-delta modulator that resides within enhanced sigma-delta modulator 24. Enhanced sigma-delta modulator 24 then oversamples the amplified signal in accordance with an oversampling rate to generate an oversampled signal and performs conventional sigma-delta modulation on the oversampled signal to generate a modulated signal. In the example of FIG. 1, enhanced sigma-delta modulator 24 outputs this modulated signal as modulated signal 25 for transmission via channel 26 to receive device 14.

Receive device 14 and, more particularly, digital-to-analog converter 22 also may implement various aspects of the techniques described in this disclosure. That is, digital-to-analog converter 22 may include enhanced sigma-delta demodulation (SDD) unit 28 that implements a form of enhanced sigma-delta demodulation consistent with the techniques described in this disclosure. Generally, the enhanced sigma-delta demodulation techniques of this disclosure are inverse to the enhance sigma-delta modulation techniques set forth in this disclosure.

To illustrate, enhanced sigma-delta demodulation unit 28 receives modulated signal 25 and performs sigma-delta demodulation to generate a demodulated signal. Enhanced sigma-delta demodulation unit 28 then down-samples the demodulated signal in accordance with a down-sampling rate to generate an down-sampled signal. This down-sampling rate may be signaled in the bitstream prior to sending modulated signal 25, statically configured to a pre-defined value, or dynamically determined from various aspects of modulated signal 25.

Enhanced sigma-delta demodulation unit 28 may then perform a form of inverse amplification on the down-sampled signal based on a determined predictive gain to generate an unamplified signal. Again, this predictive gain may be signaled in the bitstream prior to sending modulated signal 25, statically configured to a pre-defined value, or dynamically determined from various aspects of modulated signal 25. Enhanced sigma-delta demodulation unit 28 may then perform inverse predictive filtering on the unamplified signal to generate a reconstructed signal, which digital-to-analog converter unit 22 may output to audio output unit 20. Audio output unit 20 may then output this signal for consumption by a user of receive device 14.

The ability of enhanced sigma-delta modulation unit 24 provides an increase in signal SNR over comparable conventional sigma-delta modulator may be largely a function of the coding gain achieved by the linear predictive filter and the amplification. Moreover, systems that employ these techniques, such as system 10, may allow both quantization noise and channel noise to be lowered by a factor of one divided by the predictive gain and additionally shaped according to the spectral shape of the input signal. Consequently, the SNR of any given signal output by enhanced sigma-delta modulation unit 24 may be increased in comparison to conventional sigma-delta demodulators considering that the denominator of the SNR calculation is lowered in comparison to the noise experienced by convention sigma-delta modulation/demodulation systems.

Figure 2:
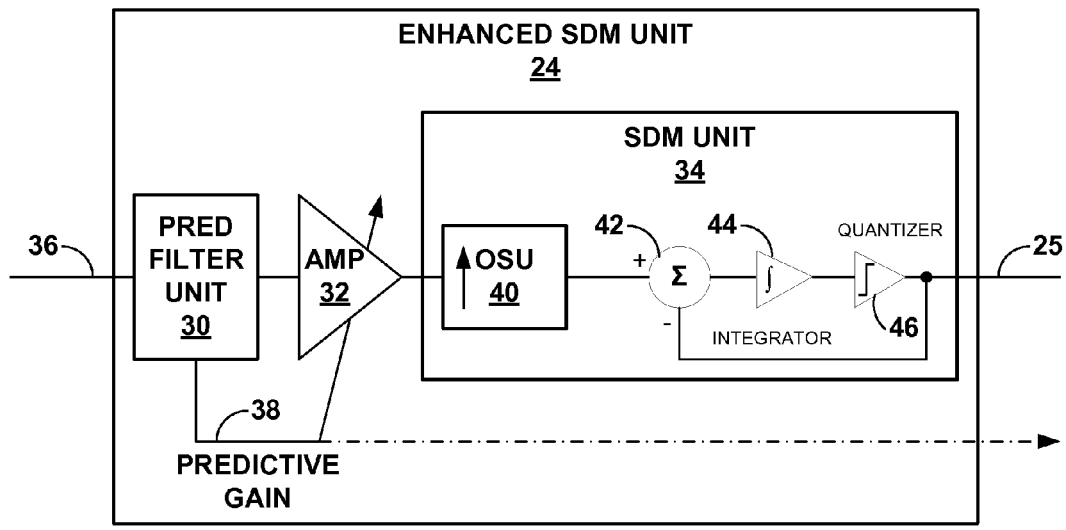
FIG. 2 is a block diagram illustrating the enhanced sigma-delta modulation unit of FIG. 1 in more detail.

FIG. 2 is a block diagram illustrating enhanced sigma-delta modulation unit 24 of FIG. 1 in more detail. As shown in the example of FIG. 2, enhanced sigma-delta modulation unit 24 includes a predictive filter unit 30 ("pred filter unit 30"), an amplifier unit 32 ("amp 32") and a sigma-delta modulation unit 34 ("SDM unit 34").

Predictive filter unit 30 represents any unit capable of performing a form of predictive filtering. As noted above, predictive filter unit 30 may implement an LMS algorithm in order to perform predictive filtering on input signal 36. Commonly, the LMS algorithm is employed to select coefficients for the filter based on present and/or past conditions of the signals. After configuring the filter coefficients, predictive filter unit 30 predicts the next or upcoming portion of input signal 36 and outputs this prediction as the filtered signal. Predictive filter 30 determines an error as the difference between the filtered signal and input signal 36. Based on this error, predictive filter unit 30 updates its filter coefficients employing the LMS algorithm to select new filter coefficients as replacements for the current filter coefficients with the intent of reducing the monitored error. In this respect, predictive filter unit 30, in real-time or near-real-time, computes its filter coefficients to efficiently filter input signal 36. Enhanced sigma-delta modulation (SDM) unit 24 may signal these filter coefficients via output signal 25 to enhanced sigma-delta demodulation (SDD) unit 28 or may separate code and signal these coefficients via a different bitstream.

Predictive filter unit 30 also computes a predictive gain factor shown in the example of FIG. 2 as predictive gain 38. As noted above, the predictive gain may be computed as a function of the energy of input signal 36 divided by the energy of the residual or filtered signal output from prediction filter unit 30. In any event, amplifier unit 32 amplifies the residual or filtered signal by predictive gain 38, outputting an amplified signal to sigma-delta modulation unit 34.

As further shown in the example of FIG. 2, sigma-delta modulation unit 34 includes an oversampling unit 40 ("OSU 40"), a summation unit 42, an integrator unit 44 (which may also be referred to as "integrator 44" as shown in the example of FIG. 2) and a quantization unit 46 (which may also be referred to as "quantizer 46" as shown in the example of FIG. 2). Oversampling unit 40 generally represents a unit that samples any given signal at a frequency that is typically twice or more than the bandwidth or highest frequency of the signal being sampled. Oversampling unit 40 oversamples the amplified signal and outputs this oversampled signal to summation unit 42. Summation unit 42 represents a unit that sums the oversampling signal with output signal 25. Summation unit 42 outputs the result of the summation as a summed signal to integrator unit 44, which generally performs a mathematical operation referred to as an integration on the summed signal to output an integrated signal. Next, quantization unit 46 performs quantization, which may be referred to informally as "rounding," on the integrated signal to output modulated signal 25.

Figure 3:
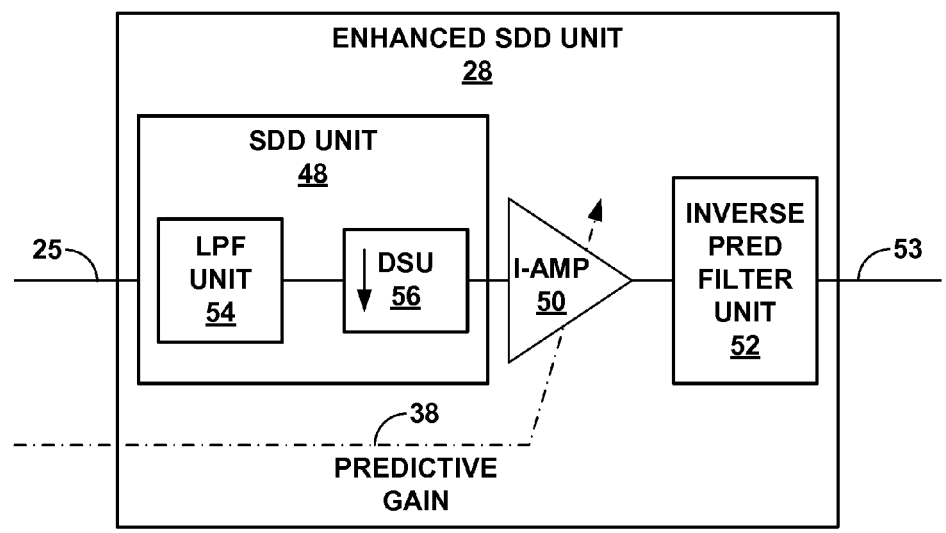
FIG. 3 is a block diagram illustrating the enhanced sigma-delta demodulation unit of FIG. 1 in more detail.

FIG. 3 is a block diagram illustrating enhanced sigma-delta demodulation unit 28 of FIG. 1 in more detail. As shown in the example of FIG. 3, enhanced sigma-delta demodulation unit 24 includes sigma-delta demodulation unit 48 ("SDD unit 48"), an inverse amplification unit 50 ("i-amp 50"), and an inverse predictive filter unit 52 ("inverse pred filter unit 52"). Generally, these units function inversely to those described above with respect to enhanced sigma-delta modulation unit 24 to generate reconstructed signal 53.

Sigma-delta demodulation unit 48 may include a low-pass filter unit 54 ("LPF unit 54") and a down-sampling unit 56 ("DSU 56"). Low-pass filter unit 54 receives modulated signal 25 and performs standard low-pass filtering on modulated signal 25 to output filtered signal to down-sampling unit 56. Down-sampling unit (DSU) 56 down-samples the filtered signal at the signaled sampling rate. That is, oversampling unit 40 may signal its oversampling rate on which down-sampling unit 56 bases its down-sampling rate. Down-sampling unit 56 outputs a resulting down-sampled signal to inverse amplification unit 50. Inverse amplification unit 50 performs inverse amplification or attenuates the signal based on predictive gain 38. As noted above, enhanced sigma-delta modulation unit 24 may signal predictive gain 38 or enhanced sigma-delta demodulation (SDD) unit 28 may derive predictive gain 38. In either event, inverse amplification unit 50 performs inverse amplification on the down-sampled signal to output an inverse amplified signal to inverse prediction filter unit 52. Inverse prediction filter unit 52 performs operations inverse to those of prediction filter unit 30 to output reconstructed signal 53.

Figure 4:
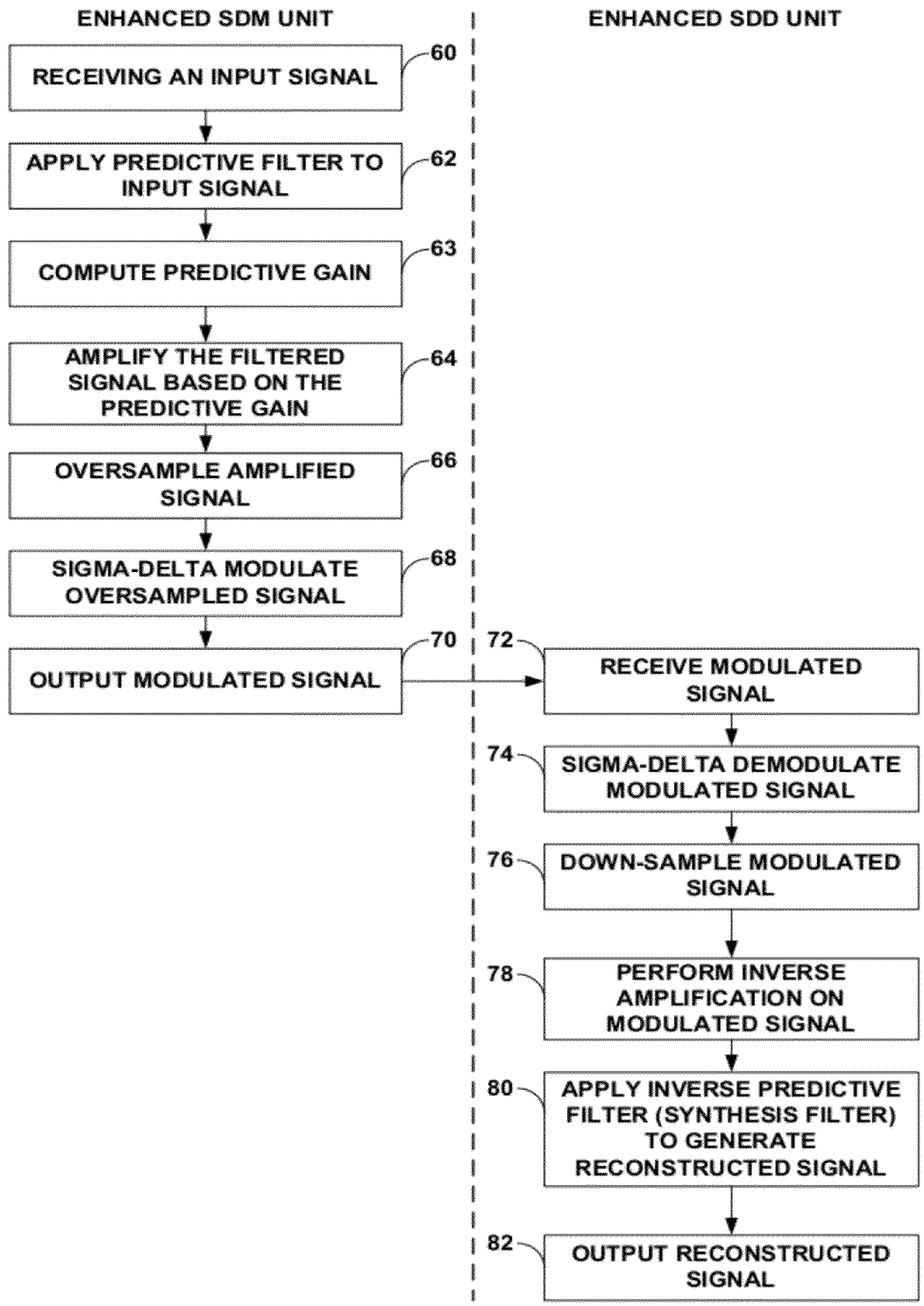
FIG. 4 is a flowchart illustrating exemplary operation of an example system consistent with the techniques of this disclosure.

FIG. 4 is a flowchart illustrating exemplary operation of a system, such as system 10 of exemplary FIG. 1, consistent with the techniques of this disclosure. Moreover, the flowchart shown in the example of FIG. 4 illustrates exemplary operation of an enhanced sigma-delta modulation unit, such as enhanced sigma-delta modulation unit 24 shown in the example of FIG. 2, and an enhanced sigma-delta demodulation unit, such as enhanced sigma-delta demodulation unit 28 shown in the example of FIG. 3. While described in the context of a system, each of the modulation and demodulation aspects of the techniques may be performed outside the context of a system and employed in the various other contexts noted above or other contexts. Consequently, the techniques of this disclosure should not be limited in this respect.

Generally, SNR performance of sigma-delta modulation may be bounded by the oversampling rate or factor and the resolution of the quantization unit. Ways of improving SNR performance include increasing the order of a sigma-delta modulation unit and constructing multistage sigma-delta modulation structures. Yet, both of these ways of improving SNR performance may result in complexity and/or stability issues.

In accordance with the techniques described in this disclosure, sigma-delta modulation may be enhanced using linear predictive filtering and amplification. Initially, predictive filter unit 30 of enhanced sigma-delta modulation unit 24 receives input signal 36 (60). Predictive filter unit 30 applies a predictive filter to input signal 36 (62). Predictive filter unit 30 outputs a filtered signal to amplification unit 32. Predictive filter unit 30 also computes a predictive gain 38 (63). Predictive filter unit 30 may compute the predictive gain 38 in accordance with the following equation (1):

$$\alpha = f\left(\frac{\|X(z)\|}{\|R(z)\|}\right). \tag{1}$$

In equation (1), α represents predictive gain 38, the variable f refers to a function that is generally smooth, invertible and acts as a compander to minimize the range of predictive gain 38, X(z) denotes input signal 36 and R(z) denotes the filtered signal. The ||.|| denotes an estimated energy of the signal embedded between the ||.||. Predictive filter unit 30 outputs this predictive gain to amplification unit 32.

Amplification unit 32 then amplifies the filtered signal (as represented by the function R(z)) based on predictive gain 38 (64). Amplification unit 32 outputs an amplified signal to sigma-delta modulation unit 34. Oversampling unit 40 of sigma-delta modulation unit 34 oversamples the amplified signal, outputting an oversampled signal (66). Summation unit 42, integration unit 44 and quantization unit 46 perform sigma-delta modulation on the oversampled signal and output a modulated signal 25 (68, 70).

Sigma-delta demodulation unit 48 of enhanced sigma-delta demodulation unit 28 receives modulated signal 25 (72). In the absence of channel errors or errors introduced by channel 26, sigma-delta demodulation unit 48 receives modulated signal 25 that can be described by the following equation (2):

$$\alpha R(z)+NTF(z)Q(z). \tag{2}$$

In equation (2), NTF (z)Q(z) represents the added shaped noise of quantization unit 46 of enhanced sigma-delta modulation unit 24. Sigma-delta demodulation unit 48 performs sigma-delta demodulation to output a demodulated signal (74). Down-sampling unit 56 down-samples modulated signal to output a down-sampled signal to inverse amplification unit 50 (76).

Inverse amplification unit 56 then performs inverse amplification on the down-sampled, modulated signal in accordance with predictive gain 38 (78). As noted above, predictive gain 38 may be signaled by enhanced sigma-delta modulation unit 24 or enhanced sigma-delta demodulator unit 28 may derive predictive gain 38 from modulated signal 25 or another signal. This inverse amplified signal is received by inverse predictive filter unit 52 (which may also be referred to as a synthesis filter unit 52), which performs inverse predictive filtering or synthesis filtering on the inverse amplified signal to generate reconstructed signal 53 (80). Enhanced SDD unit 28 may then output reconstructed signal 53, e.g., for use by audio input unit 20 in reproducing the original sensed input signal sensed by audio input unit 16. Reconstructed signal 53 may be described mathematically by the following equation (3):

$$Y(z) = \frac{1}{\alpha A(z)}[\alpha A(z)X(z) + NTF(z)Q(z)] \tag{3}$$

$$= X(z) + \frac{1}{\alpha}\frac{NTF(z)}{A(z)}Q(z).$$

Referring to equation (3) above, Y(z) represents reconstructed signal 53, X(z) again represents input signal 36, α represents predictive gain 38, A(z) represents the predictive filter function and NTF(z)Q(z) represents the added shaped noise of quantization unit 46 of enhanced sigma-delta modulation unit 24. Reviewing equation (3) within the context of system 10, systems such as system 10, according to equation (3) allow the quantization noise to be lowered by a factor of 1/α and additionally shaped according to the spectral shape of the input signal.

Assuming a certain amount of channel noise is introduced into system 10, as represented by N(z), enhanced sigma-delta demodulation unit 28 receives modulated signal 25 such that it can be described mathematically by the following equation (4):

$$\alpha R(z)+NTF(z)Q(z)+N(z). \tag{4}$$

Carrying this forward in the manner noted above with respect to equation (3) and applying equation (4) in the context of system 10 that includes channel noise N(z), reconstructed signal 25 may be mathematically described by the following equation (5):

$$Y(z) = \frac{1}{\alpha A(z)}[\alpha A(z)X(z) + NTF(z)Q(z) + N(Z)] \tag{5}$$

$$= X(z) + \frac{NTF(z)}{\alpha A(z)}Q(z) + \frac{1}{\alpha A(z)}N(z).$$

Equation (5) demonstrates that system 10 allows both quantization noise and channel noise to be lowered by a factor of $1/\alpha$ and additionally shaped according to the spectral shape of the input signal.

In implementing system 10, there are a number of considerations. First, as generally explained above, the SNR gain (and channel noise suppression) depends primarily on the coding gain achieved by predictive filter unit 30. While predictive filtering generally works well during intervals filled with loud tonal music content, during silences (or near silent or mostly noise filled portions of the signal), predictive filter unit 30 rarely shows any gains in some examples. Thus, when implementing system 10, system 10 may be modified to include a unit that modifies input signal 36 by mixing input signal 36 with a low-magnitude, high-frequency tone represented by $\xi_{1/T_S}$ in the following equation (6):

$$X'(z) = X(z) + \xi_{1/T_S}(z) \tag{6}$$

The modified signal is represented in equation (6) as X'(z). The magnitude of this tone is typically set to be approximately −40 dB. Using this magnitude, the gain that would result from predicting this tone during silent regions would be up to about 30-40 dB. The frequency for this tone usually may be set at the Nyquist frequency so as to facilitate generation and removal of this tone from the signal.

Second, good performance of a predictive filter is, as a general rule, achieved when this filter has one pole for each significant harmonic in input signal 25. Therefore, in working with simple audio signals and speech, when only about five harmonics are essential, one can use short (e.g., 10-tap) predictive filters. However, when working with complex signals, such as one produced by an orchestra or even some peculiar instruments (such as a pitch pipe), there can be dozens of harmonics that lead to very large predictive filters. Moreover, some of these harmonics in complex signals may reside at very low frequencies, implying that filtering has to be hundreds of taps long. Implementing a hundred or more tap long predictive filter may involve significant complications and lead to a very complex implementation that consumes significant amounts of power. This can be particularly troublesome when these predictive filters are employed in low-power applications, such as for use in a mobile telephone handset, including so-called smart phones.

Rather than rely on simple linear predictive filtering, the above techniques may be adapted so as to add a so-called "long-term predictive (LTP) filter," which is also sometimes referred to as a "pitch filter." A LTP filter is a filter that attempts to track or long delay phenomena, such as low frequency portions of an input signal. Assuming that predictive filter unit 30 generally includes a 10-tap linear predictive coding (LPC) filter, the adapted techniques may modify predictive filter unit 30 to add a LTP filter. LPC filter generally represents a filter for representing the spectral envelope of a digital signal in compressed form, using information of a linear predictive model. In this instance, the linear predictive model may model the underlying origin or agent that produces the signal in an attempt to predict a next portion of the input signal. Generally, LPC filters are employed to compress speech as the human speech system is generally modeled as a buzzer at the end of a tube, however, these filters may be employed in a number of other contexts. The output of adapted predictive filtering unit 30, which may be referred to as predictive filtering unit 30', may be described mathematically by the following equation (7):

$$r'(i) = r(i) - \rho \Sigma_{j=-L}^{L} \omega(j) r(i - \tau + j), \tag{7}$$

where τ denotes lag, ρ is the gain value, ω are the coefficients of a 2L+1-tap low pass filter, r(i) is the input residual sequence, and y(i) is the modified residual sequence [Yuriy.

Predictive gain 38, as noted above, can be estimated in accordance with the above equation (1) when predictive filter unit 30 includes only the LPC filter. When predictive filter unit 30' includes the LPC filter and the LTP filter, predictive gain 38 may be estimated using the following equation (8) set forth below:

$$\alpha = f\left(\frac{\|X(z)\|}{\|R'(z)\|}\right). \tag{8}$$

In equation (8), α represents predictive gain 38, the variable f refers to a function that is generally smooth, invertible and acts as a compander to minimize the range of predictive gain 38, X(z) denotes input signal 36 and R'(z) denotes the output of this predictive filter unit 30'. While a single LTP filter improves the performance of predictive filtering, in some instances, this single LTP filter fails to adequately match or predict the lower-part of the spectrum. In these instances, it may be beneficial to add one or more additional LTP filters to predictive filtering unit 30'. In the two LTP filter configuration, these LTP filters may be designed to have lags in non-overlapping ranges from P+1 to 200 and from 200 to 400, where P denotes the predictor's order. The addition of these filters may also minimize sensitivity of the system to channel noise.

Third, in some instances, a backwards-adaptive system may be desired that does not rely on signaling to communicate, for example, the predictive gain, filter coefficients, and the like. While in many practical designs the signaling of this data or parameters may be separately encoded and transmitted (considering that the rate needed for this parameter transmission is negligible compared to the rate of the residual data), if there is a need to preserve a homogeneous bitstream similar to what sigma-delta modulation provides in its conventional or non-enhanced form, another approach may be employed. This alternative approach may rely on backwards adaptive LPC and/or LTP filters in both the encoder and the decoder. For more information regarding backwards apaptive LPC and/or LTP filters including computation of the filter coefficients for these backwards adaptive systems can be found in a document entitled "High-Quality 16 kb/s Speech Coding with a One Way Delay Less than 2 ms," by J.-H. Chen, in *Proc. ICASSP*-91, pp. 453-456 (April 1990), which is hereby incorporated by reference as if fully set forth herein.

Figure 5:
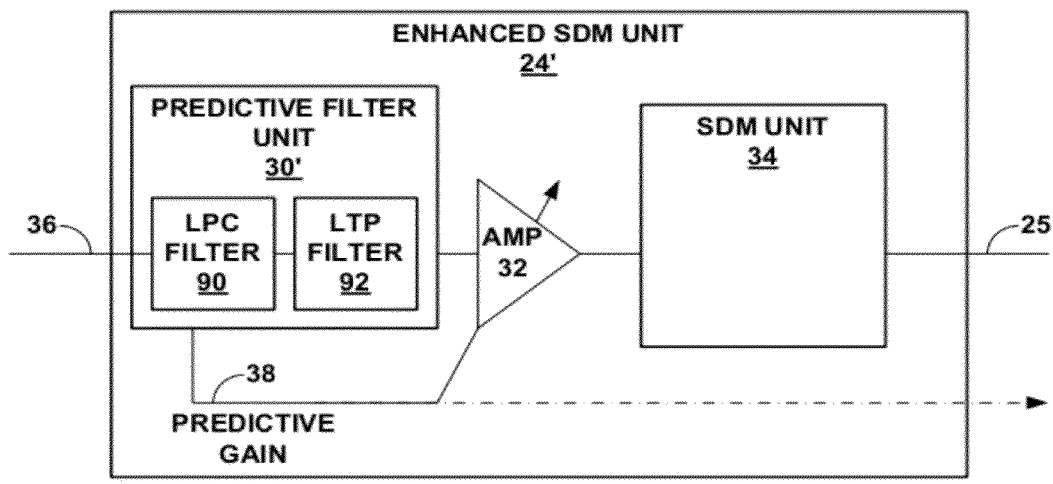
FIG. 5 is a block diagram illustrating another example implementation of the enhanced sigma-delta modulation unit shown in the example of FIG. 1.

FIG. 5 is a block diagram illustrating another example implementation of enhanced sigma-delta modulation unit 24 shown in the example of FIG. 1. This implementation may be denoted as enhanced sigma-delta modulation unit 24'. In this example, predictive filter unit 30 shown in the example of FIG. 2 has been replaced with adapted predictive filter unit 30', which may include a LPC filter 90 and a LTP filter 92. LPC filter 90 generally represents a filter for representing the spectral envelope of a digital signal in compressed form, using information of a linear predictive model. In this instance, the linear predictive model may model the underlying origin or agent that produces the signal in an attempt to predict a next portion of the input signal. Generally, LPC filters are employed to compress speech as the human speech system is generally modeled as a buzzer at the end of a tube, however, these filters may be employed in a number of other contexts. LTP filter 92, as described above, may improve matching or prediction at lower frequencies.

Figure 6:
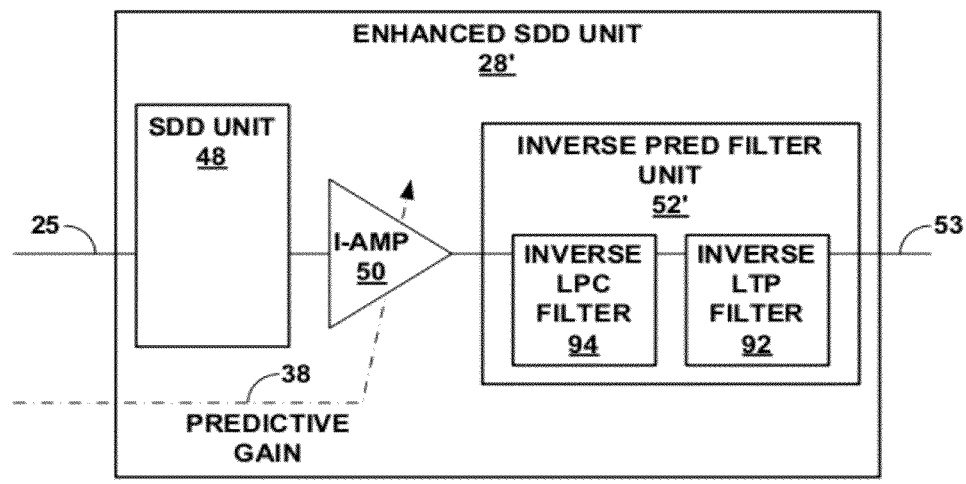
FIG. 6 is a block diagram illustrating another example implementation of the enhanced sigma-delta demodulation unit shown in the example of FIG. 1.

FIG. 6 is a block diagram illustrating another example implementation of enhanced sigma-delta demodulation unit 28 shown in the example of FIG. 1. This implementation may be denoted as enhanced sigma-delta demodulation unit 28'. In this example, inverse predictive filtering unit 52 has been replaced by adapted inverse predictive filtering unit 52'. Adapted inverse predictive filtering unit 52' includes an inverse LTP filter 92 and an inverse LPC filter 94. Again, the addition of inverse LTP filter 92 may improve prediction at lower frequencies.

Figure 7:
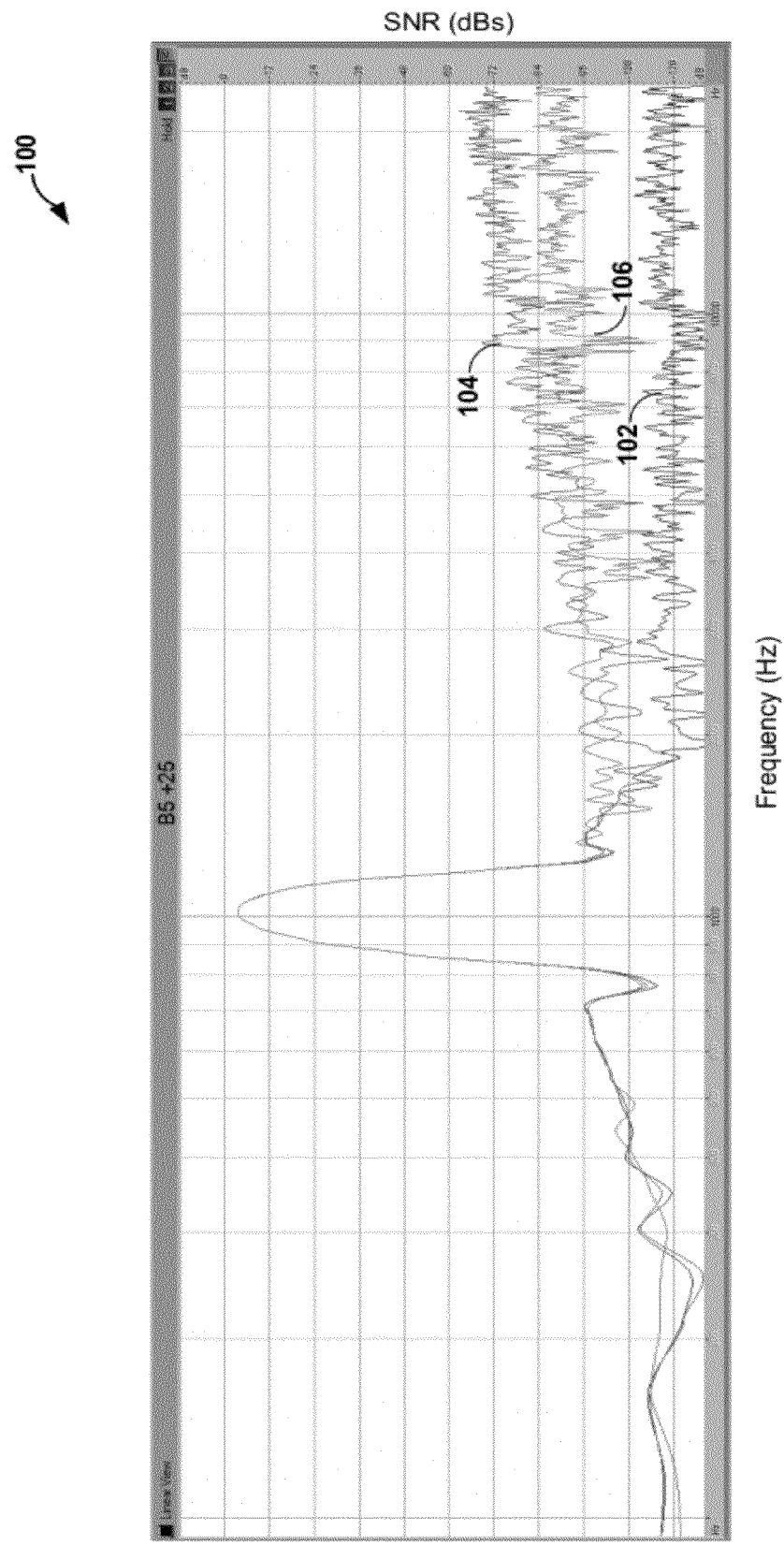
FIGS. 7-10 are diagrams illustrating various graphs that present a signal-to-noise ratio (SNR) of a reconstructed signal output by an enhanced sigma-delta demodulation unit that implements the techniques described in this disclosure.

FIG. 7 is a diagram illustrating a graph 100 that presents a signal-to-noise ratio (SNR) of a reconstructed signal output by an enhanced sigma-delta demodulation unit that implements the techniques described in this disclosure, such as enhanced sigma-delta demodulation unit 28 shown in the example of FIG. 3, as a function of the input signal frequency. In the example of FIG. 7, graph 100 includes three lines 102, 104, and 106. Line 102 represents the input signal, such as input signal 36. The input signal represented by line 102 in this example represents an SNR of a 1 kilohertz (1 kHz) sine signal. Line 104 represents an SNR of a reconstructed 2nd order, 16-bit oversampled conventional SDM encoded sample. Line 106 represents an SNR of a reconstructed $2^{nd}$ order LPC plus $2^{nd}$ order enhanced SMD encoded signal with a predictive gain factor of approximately 16.6. Line 106 clearly provides a better SNR in comparison to line 104, reflecting the improved SNR of signals communicated using the techniques described in this disclosure.

Figure 8:
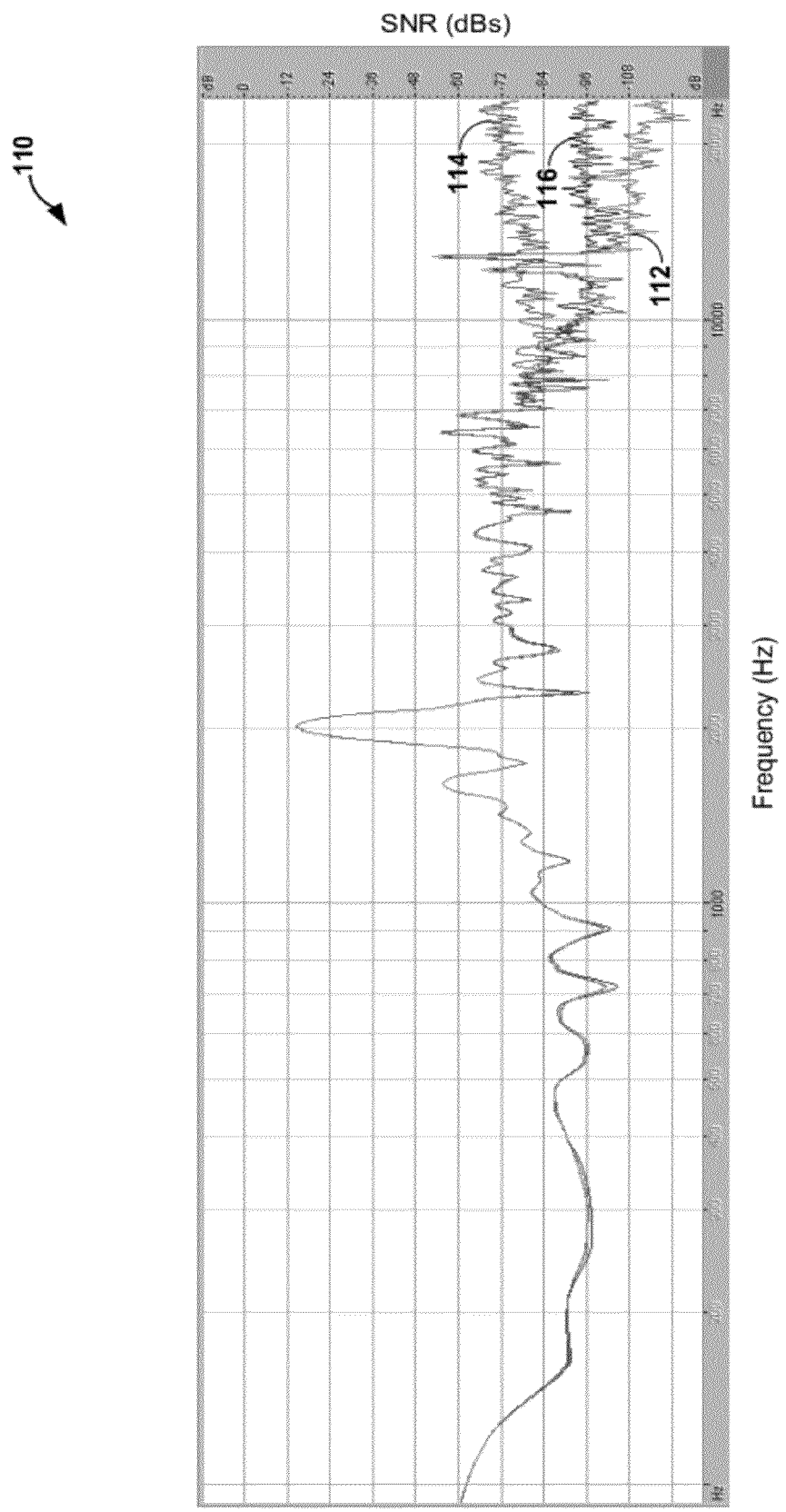

FIG. 8 is a diagram illustrating a graph 110 that presents a signal-to-noise ratio (SNR) of a reconstructed signal output by an enhanced sigma-delta demodulation unit that implements the techniques described in this disclosure, such as enhanced sigma-delta demodulation unit 28 shown in the example of FIG. 3, as a function of the input signal frequency. In the example of FIG. 8, graph 110 includes three lines 112, 114, and 116. Line 112 represents the SNR of an input signal, such as input signal 36. The input signal represented by line 112 in this example represents a spectra of a so-called superposed quadrature amplitude modulation (SQAM) "triangles" signal. Line 104 represents a SNR of a reconstructed conventional SDM encoded sample, where the SDM does not involve enhancements in accordance with the techniques of this disclosure. Line 106 represents an SNR of an enhanced SMD reconstructed signal. Again, line 116 clearly provides a better SNR in comparison to line 114, reflecting the improved SNR of signals communicated using the techniques described in this disclosure.

Figure 9A:
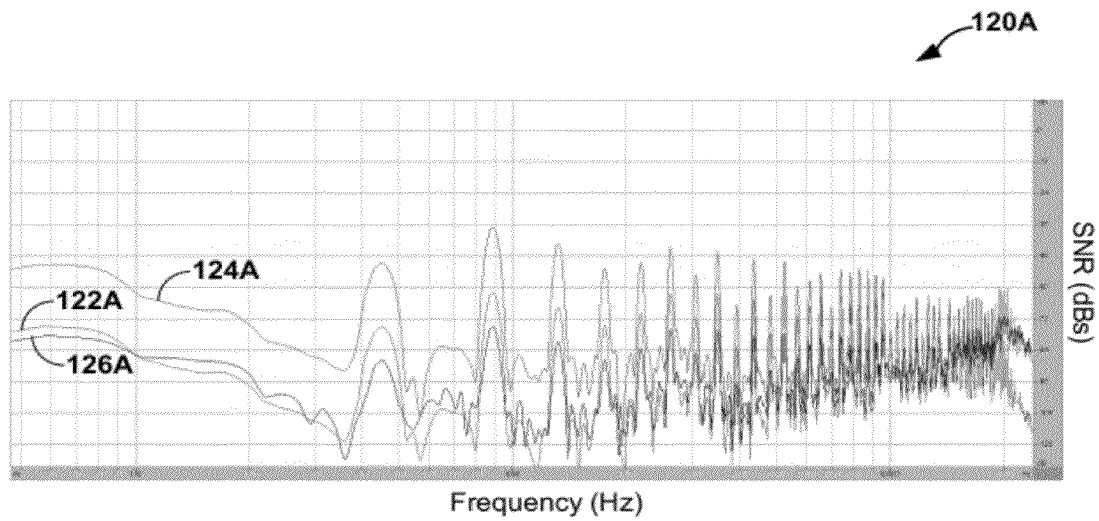
Figure 9B:
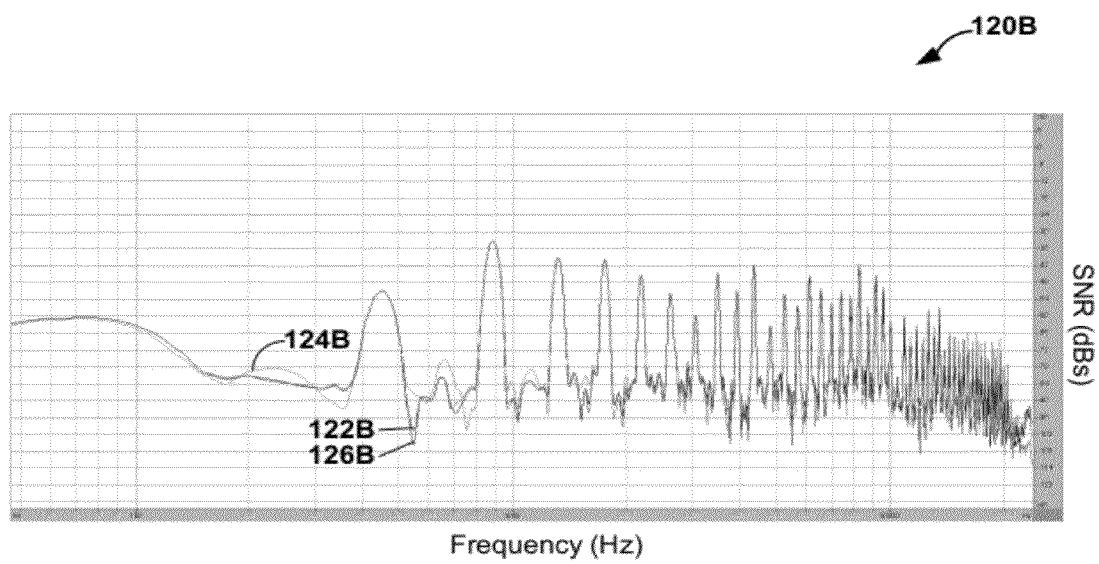

FIGS. 9A and 9B are diagrams illustrating graphs 120A, 120B that present respectively a signal-to-noise ratio (SNR) of a reconstructed signal output by an enhanced sigma-delta demodulation unit, such as enhanced sigma-delta demodulation unit 28 of FIG. 3, and a reconstructed signal output by an adapted enhanced sigma-delta demodulation unit, such as enhanced sigma-delta demodulation unit 28' of FIG. 6, as a function of the input signal frequency. In graph 120A of FIG. 9A, three lines 122A, 124A and 126A are shown. Line 122A represents an SNR of a spectra of a so-called Moving Pictures Expert Group (MPEG) "pitchpipe" signal. Line 124A represents a SNR for a reconstructed signal that was reconstructed, for example, by enhanced sigma-delta demodulation unit 28 using a 10-order LPC filter. Line 126A represents an SRN for a reconstructed signal that was reconstructed by, for example, enhanced sigma-delta demodulation unit 28' using only LTP filtering. Line 126A clearly represents an improvement over line 124A in terms of SNR, reflecting that the addition of an LTP filter may improve SNR for certain types of signals.

In graph 120B of FIG. 9B, three lines 122B, 124B and 126B are shown. In this graph, line 122B represents the original input signal, line 124B represents the SNR for a reconstructed signal output by enhanced sigma-delta demodulation unit 28 and line 126B represents the SNR for a reconstructed signal output by enhanced sigma-delta demodulation unit 28'. Considering these lines 122B, 124B and 126B, it seems that LTP helps with overall matching of the spectrum shape in lower parts of the spectrum but that there are still significant mismatches between the original and the reconstructed signals.

Figure 10:
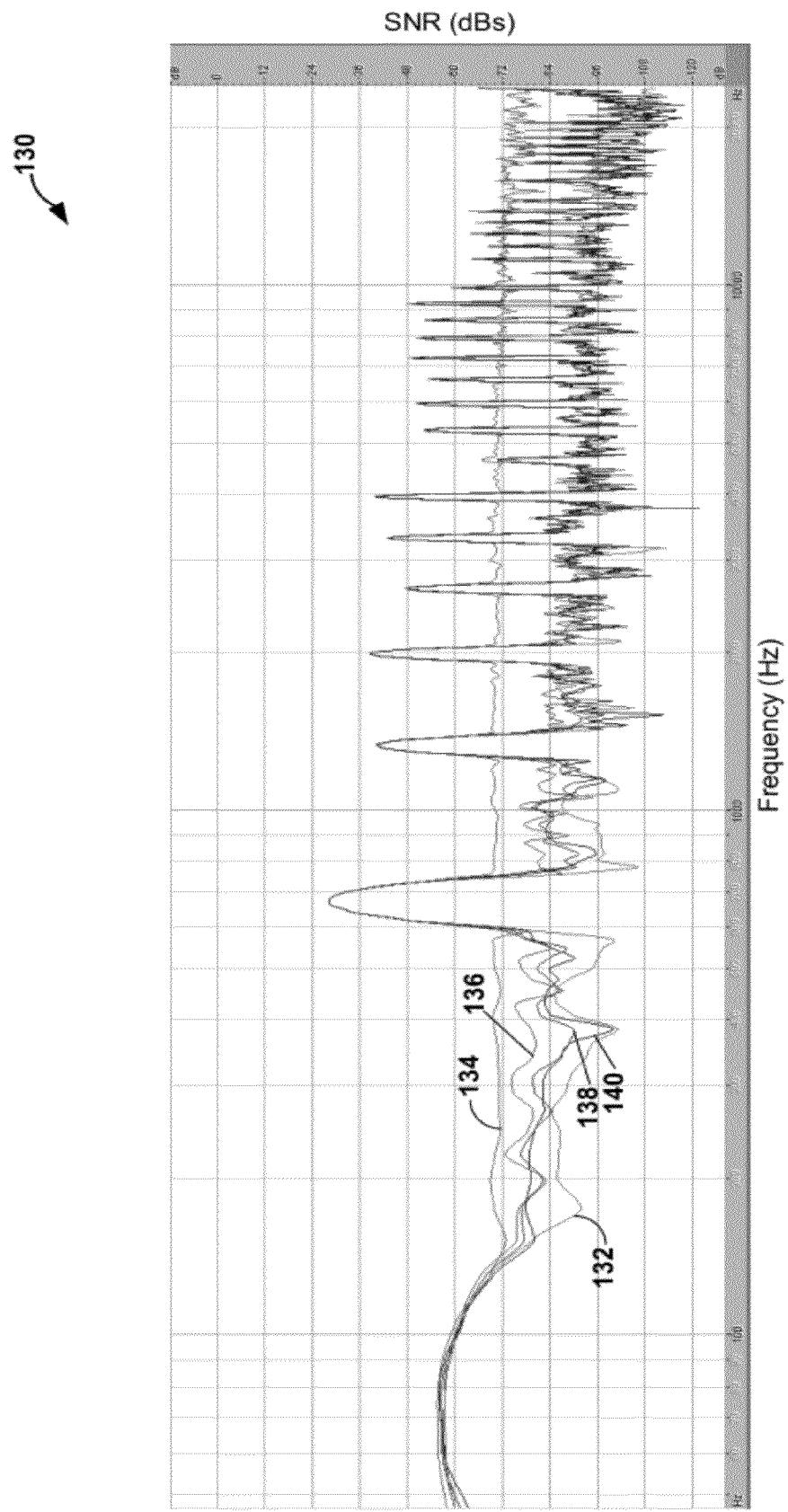

FIG. 10 is a diagram illustrating a graph 130 that presents a signal-to-noise ratio (SNR) of a reconstructed signals output by various conventional and enhanced sigma-delta demodulation units as a function of the input signal frequency. In the example of FIG. 10, graph 130 includes five lines, lines 132, 134, 136, 138 and 140. Line 132 represents the SNR of the original input signal. Line 134 represents a SNR of a reconstructed conventional SDM encoded sample, where the SDM does not involve enhancements in accordance with the techniques of this disclosure. Line 136 represents an SNR of an enhanced SMD reconstructed signal where this reconstructed signal was reconstructed with a 10-th order LPC filter. Line 138 represents an SNR of an enhanced SMD reconstructed signal where this reconstructed signal was reconstructed using both an LPC and LTP filter, such as that employed by enhanced sigma-delta demodulation unit 28' shown in the example of FIG. 6. Line 138 represents an SNR of an enhanced SMD reconstructed signal where this reconstructed signal was reconstructed using both an LPC and two stages of LTP filters. Again, line 140 clearly provides a better SNR in comparison to lines 134, 136, and 138, reflecting the improved SNR of signals communicated using the adapted techniques described in this disclosure that provide for multiple state LTP filters.

In one or more examples, the functions described may be implemented in hardware, software, firmware, or any combination thereof. If implemented in software, the functions may be stored on or transmitted over as one or more instructions or code on a computer-readable medium. Computer-readable media may include non-transitory computer storage media or communication media including any medium that facilitates transfer of a computer program from one place to another. Data storage media may be any available media that can be accessed by one or more computers or one or more processors to retrieve instructions, code and/or data structures for implementation of the techniques described in this disclosure. By way of example, and not limitation, such data storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The code may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

The invention claimed is:

1. A method of performing enhanced sigma delta modulation, the method comprising:
   applying, with an apparatus, a predictive filter to an input signal so as to generate a filtered signal from the input signal;
   computing an estimate of a predictive gain as a function of an energy of the input signal and an energy of the filtered signal;
   amplifying, with the apparatus, the filtered signal based on the estimate of the predictive gain to generate an amplified signal;
   oversampling, with the apparatus, the amplified signal in accordance with an oversampling rate to generate an oversampled signal; and
   performing sigma-delta modulation on the oversampled signal to generate a modulated signal.

2. The method of claim 1, wherein applying the predictive filter includes performing linear predictive coding (LPC) on the input signal to generate the filtered signal.

3. The method of claim 1, wherein applying the predictive filter includes performing long-term predictive (LTP) filtering on the input signal to generate the filtered signal.

4. The method of claim 1, wherein applying the predictive filter includes performing linear predictive coding (LPC) followed by long-term predictive (LTP) filtering on the input signal to generate the filtered signal.

5. The method of claim 1, wherein applying the predictive filter includes performing linear predictive coding (LPC) followed by second or higher-than-second order long-term predictive (LTP) filtering on the input signal to generate the filtered signal.

6. The method of claim 1, wherein performing sigma-delta modulation on the oversampled signal comprises performing second or higher-than-second order sigma-delta modulation on the oversampled signal.

7. The method of claim 1, further comprising configuring the function used to compute the estimate of the predictive gain to be smooth and invertible, wherein the configured function acts as a compander that minimizes the range of possible values for the estimate of the predictive gain.

8. The method of claim 1, wherein performing sigma-delta modulation includes:
   summing the oversampled signal with the modulated signal to output a summed signal;
   performing integration on the summed signal to output an integrated signal; and
   performing quantization on the integrated signal to output the modulated signal.

9. The method of claim 1,
   wherein the input signal comprises an analog signal, and
   wherein the modulated signal comprises a digital signal.

10. The method of claim 1, wherein one or more of the oversampling rate and the estimate of the predictive gain are signaled to a receiving device that receives the modulated signal.

11. An apparatus that performs enhanced sigma delta modulation comprising:
    a predictive filter unit that performs predictive filtering on an input signal to generate a filtered signal and computes an estimate of a predictive gain as a function of an energy of the input signal and an energy of the filtered signal;
    an amplifier that receives the filtered signal and amplifies the filtered signal based on the predictive gain to generate an amplified signal;
    an oversampling unit that receives the amplifies signal and oversamples the amplified signal in accordance with an oversampling rate to generate an oversampled signal; and
    a sigma-delta modulation unit that receives the oversampled signal and performs sigma-delta modulation to generate a modulated signal.

12. The apparatus of claim 11, wherein the predictive filter unit performs linear predictive coding (LPC) on the input signal to generate the filtered signal.

13. The apparatus of claim 11, wherein the predictive filter unit performs long-term predictive (LTP) filtering on the input signal to generate the filtered signal.

14. The apparatus of claim 11, wherein the predictive filter unit performs linear predictive coding (LPC) followed by long-term predictive (LTP) filtering on the input signal to generate the filtered signal.

15. The apparatus of claim 11, wherein the predictive filter performs linear predictive coding (LPC) followed by second or higher-than-second order long-term predictive (LTP) filtering on the input signal to generate the filtered signal.

16. The apparatus of claim 11, wherein the sigma-delta modulation unit performs second or higher-than-second order sigma-delta modulation on the oversampled signal.

17. The apparatus of claim 11, wherein the function used to compute the estimate of the predictive gain is configured to be smooth and invertible, wherein the configured function acts as a compander that minimizes the range of possible values for the estimate of the predictive gain.

18. The apparatus of claim 11, wherein the sigma delta modulation unit sums the oversampled signal with the modulated signal to output a summed signal, performs integration on the summed signal to output an integrated signal and performs quantization on the integrated signal to output the modulated signal.

19. The apparatus of claim 11,
    wherein the apparatus includes an analog-to-digital (A-to-D) converter, and
    wherein the A-to-D converter comprises the predictive filter, the amplifier, the oversampling unit, and a sigma-delta modulation.

20. The apparatus of claim 11, wherein one or more of the oversampling rate and the estimate of the predictive gain are signaled to a receiving device that receives the modulated signal.

21. An apparatus that performs enhanced sigma delta modulation comprising:
means for performing predictive filtering on an input signal to generate a filtered signal and computes an estimate of a predictive gain as a function of an energy of the input signal and an energy of the filtered signal;
means for amplifying the filtered signal based on the predictive gain to generate an amplified signal;
means for oversampling the amplified signal in accordance with an oversampling rate to generate an oversampled signal; and
means for performing sigma-delta modulation on the oversampled signal to generate a modulated signal.

22. The apparatus of claim 21, wherein the means for performing predictive filtering includes means for performing linear predictive coding (LPC) on the input signal to generate the filtered signal.

23. The apparatus of claim 22, wherein the means for performing predictive filtering includes means for performing long-term predictive (LTP) filtering on the input signal to generate the filtered signal.

24. The apparatus of claim 22, wherein the means for performing predictive filtering includes means for performing linear predictive coding (LPC) followed by means for performing long-term predictive (LTP) filtering on the input signal to generate the filtered signal.

25. The apparatus of claim 22, wherein the predictive filter performs linear predictive coding (LPC) followed by means for performing second or higher-than-second order long-term predictive (LTP) filtering on the input signal to generate the filtered signal.

26. The apparatus of claim 22, wherein the means for performing sigma-delta modulation includes means for performing second or higher-than-second order sigma-delta modulation on the oversampled signal.

27. The apparatus of claim 22, wherein the function used to compute the estimate of the predictive gain is configured to be smooth and invertible, wherein the configured function acts as a compander that minimizes the range of possible values for the estimate of the predictive gain.

28. The apparatus of claim 22, wherein the means for performing sigma delta modulation includes:
means for summing the oversampled signal with the modulated signal to output a summed signal;
means for performing integration on the summed signal to output an integrated signal; and
means for performing quantization on the integrated signal to output the modulated signal.

29. The apparatus of claim 22,
wherein the apparatus includes an analog-to-digital (A-to-D) converter, and
wherein the A-to-D converter includes the means for performing predictive filtering, the means for amplifying, the means for performing oversampling, and the means for performing sigma-delta modulation.

30. The apparatus of claim 22, wherein one or more of the oversampling rate and the estimate of the predictive gain are signaled to a receiving device that receives the modulated signal.

31. A non-transitory computer-readable storage medium that stores instructions for causing a processor to perform enhanced sigma delta modulation, the instructions, when executed by the processor, cause the processor to:
apply a predictive filter to an input signal so as to generate a filtered signal from the input signal;
compute an estimate of a predictive gain as a function of an energy of the input signal and an energy of the filtered signal;
amplify the filtered signal based on the estimate of the predictive gain to generate an amplified signal;
oversample the amplified signal in accordance with an oversampling rate to generate an oversampled signal; and
perform sigma-delta modulation on the oversampled signal to generate a modulated signal.

32. The non-transitory computer-readable storage medium of claim 31, wherein the instructions further cause the processor to perform linear predictive coding (LPC) on the input signal to generate the filtered signal.

33. The non-transitory computer-readable storage medium of claim 31, wherein the instructions further cause the processor to perform long-term predictive (LTP) filtering on the input signal to generate the filtered signal.

34. The non-transitory computer-readable storage medium of claim 31, wherein the instructions further cause the processor to perform linear predictive coding (LPC) followed by long-term predictive (LTP) filtering on the input signal to generate the filtered signal.

35. The non-transitory computer-readable storage medium of claim 31, wherein the instructions further cause the processor to perform linear predictive coding (LPC) followed by second or higher-than-second order long-term predictive (LTP) filtering on the input signal to generate the filtered signal.

36. A method of performing enhanced sigma delta demodulation, the method comprising:
receiving, with an apparatus, a modulated signal that was modulated using enhanced sigma-delta modulation;
performing, with the apparatus, sigma-delta demodulation on the modulated signal to generate a demodulated signal;
down-sampling, with the apparatus, the demodulated signal in accordance with a down-sampling rate to generate a down-sampled signal;
performing, with the apparatus, inverse amplification on the down-sampled signal based on a determined predictive gain to generate an unamplified signal; and
performing, with the apparatus, inverse predictive filtering on the unamplified signal to generate a reconstructed signal.

37. The method of claim 36, wherein performing the inverse predictive filtering includes performing inverse linear predictive coding (LPC) on the unamplified signal to generate the reconstructed signal.

38. The method of claim 36, wherein performing inverse predictive filtering includes performing inverse long-term predictive (LTP) filtering on the unamplified signal to generate the reconstructed signal.

39. The method of claim 36, wherein performing inverse predictive filtering includes performing inverse linear predictive coding (LPC) followed by inverse long-term predictive (LTP) filtering on the unamplified signal to generate the reconstructed signal.

40. The method of claim 36, wherein performing inverse predictive filtering includes performing inverse linear predictive coding (LPC) followed by second or higher-than-second order inverse long-term predictive (LTP) filtering on the unamplified signal to generate the reconstructed signal.

41. The method of claim 36, wherein performing sigma-delta demodulation on the modulated signal comprises performing second or higher-than-second order sigma-delta demodulation on the modulated signal.

42. The method of claim 36, wherein performing sigma-delta demodulation includes:
performing low-pass filtering on the oversampled signal to generate a low-pass filtered signal; and
down-sampling the low-pass filtered signal to generate the demodulated signal.

43. The method of claim 36,
wherein the input signal includes an analog signal, and
wherein the modulated signal includes a digital signal.

44. The method of claim 36, further comprising:
receiving a signal from a device that sent the modulated signal that signals the predictive gain; and
determining the predictive gain based on the signaled predictive gain.

45. An apparatus that performs enhanced sigma-delta modulation, the apparatus comprising:
a sigma-delta demodulation unit that receives a modulated signal and performs sigma-delta demodulation to generate a demodulated signal;
a down-sampling unit that receives the demodulated signal and performs down-sampling in accordance with an down-sampling rate to generate an down-sampled signal;
an inverse amplification unit that receives the down-sampled signal and performs inverse amplification on the down-sampled signal based on a determined predictive gain to generate an unamplified signal; and
an inverse predictive filter unit that performs inverse predictive filtering on the unamplified signal to generate a reconstructed signal.

46. The apparatus of claim 45, wherein the inverse predictive filter unit performs inverse linear predictive coding (LPC) on the unamplified signal to generate the reconstructed signal.

47. The apparatus of claim 45, wherein the inverse predictive filter unit performs inverse long-term predictive (LTP) filtering on the unamplified signal to generate the reconstructed signal.

48. The apparatus of claim 45, wherein the inverse predictive filter unit performs inverse linear predictive coding (LPC) followed by inverse long-term predictive (LTP) filtering on the unamplified signal to generate the reconstructed signal.

49. The apparatus of claim 45, wherein the inverse predictive filter unit performs inverse linear predictive coding (LPC) followed by second or higher-than-second order inverse long-term predictive (LTP) filtering on the unamplified signal to generate the reconstructed signal.

50. The apparatus of claim 45, wherein the sigma-delta demodulation unit performs second or higher-than-second order sigma-delta demodulation on the modulated signal.

51. The apparatus of claim 45, wherein the sigma-delta demodulation unit performs low-pass filtering on the oversampled signal to generate a low-pass filtered signal and down-samples the low-pass filtered signal to generate the demodulated signal.

52. The apparatus of claim 45,
wherein the apparatus includes a digital-to-analog (D-to-A) converter, and
wherein the D-to-A converter includes the sigma-delta demodulation unit, the down-sampling unit, the inverse amplification unit, and the inverse predictive filter unit.

53. The apparatus of claim 45, wherein the apparatus receives a signal from a device that sent the modulated signal which signals the predictive gain and determines the predictive gain based on the signaled predictive gain.

54. An apparatus for performing enhanced sigma delta demodulation, the apparatus comprising:
means for receiving a modulated signal that was modulated using enhanced sigma-delta modulation;
means for performing sigma-delta demodulation on the modulated signal to generate a demodulated signal;
means for down-sampling the demodulated signal in accordance with a down-sampling rate to generate a down-sampled signal;
means for performing inverse amplification on the down-sampled signal based on a determined predictive gain to generate an unamplified signal; and
means for performing inverse predictive filtering on the unamplified signal to generate a reconstructed signal.

55. The apparatus of claim 54, further comprising means for performing inverse linear predictive coding (LPC) on the unamplified signal to generate the reconstructed signal.

56. The apparatus of claim 54, further comprising means for performing inverse long-term predictive (LTP) filtering on the unamplified signal to generate the reconstructed signal.

57. The apparatus of claim 54, further comprising means for performing inverse linear predictive coding (LPC) followed by inverse long-term predictive (LTP) filtering on the unamplified signal to generate the reconstructed signal.

58. The apparatus of claim 54, further comprising means for performing inverse linear predictive coding (LPC) followed by second or higher-than-second order inverse long-term predictive (LTP) filtering on the unamplified signal to generate the reconstructed signal.

59. The apparatus of claim 54, further comprising means for performing second or higher-than-second order sigma-delta demodulation on the modulated signal.

60. The apparatus of claim 54, further comprising:
means for performing low-pass filtering on the oversampled signal to generate a low-pass filtered signal; and
means for down-sampling the low-pass filtered signal to generate the demodulated signal.

61. The apparatus of claim 54,
wherein the apparatus includes a digital-to-analog (D-to-A) converter, and
wherein the D-to-A converter includes the means for receiving the modulated signal, the means for performing sigma-delta demodulation, the means for down-sampling, the means for performing inverse amplification, and the means for performing inverse predictive filtering.

62. The apparatus of claim 54, further comprising:
means for receiving a signal from a device that sent the modulated signal that signals the predictive gain; and
means for determining the predictive gain based on the signaled predictive gain.

63. A non-transitory computer-readable storage medium that stores instructions for causing a processor to perform enhanced sigma delta modulation, the instructions, when executed by the processor, cause the processor to:
receive a modulated signal that was modulated using enhanced sigma-delta modulation;
perform sigma-delta demodulation on the modulated signal to generate a demodulated signal;
down-sample the demodulated signal in accordance with a down-sampling rate to generate a down-sampled signal;
perform inverse amplification on the down-sampled signal based on a determined predictive gain to generate an unamplified signal; and
perform inverse predictive filtering on the unamplified signal to generate a reconstructed signal.

64. The non-transitory computer-readable storage medium of claim 63, wherein the instructions further cause the processor to perform inverse linear predictive coding (LPC) on the unamplified signal to generate the reconstructed signal.

65. The non-transitory computer-readable storage medium of claim 63, wherein the instructions further cause the processor to perform inverse long-term predictive (LTP) filtering on the unamplified signal to generate the reconstructed signal.

66. The non-transitory computer-readable storage medium of claim 63, wherein the instructions further cause the processor to perform inverse linear predictive coding (LPC) followed by inverse long-term predictive (LTP) filtering on the unamplified signal to generate the reconstructed signal.

67. The non-transitory computer-readable storage medium of claim 63, wherein the instructions further cause the processor to perform inverse linear predictive coding (LPC) followed by second or higher-than-second order inverse long-term predictive (LTP) filtering on the unamplified signal to generate the reconstructed signal.

* * * * *